United States Patent
Hafner et al.

[11] 3,931,388
[45] Jan. 6, 1976

[54] CRYSTAL RESONATOR HOUSING CONFIGURATIONS

[75] Inventors: Erich Hafner, New Shrewsbury; John R. Vig, Colts Neck, both of N.J.

[73] Assignee: The United States of America as represented by the Secretary of the Army, Washington, D.C.

[22] Filed: May 31, 1974

[21] Appl. No.: 475,077

[52] U.S. Cl. .................. 310/9.4; 310/8.9; 310/8.2
[51] Int. Cl.² ........................................ H01L 41/04
[58] Field of Search ........................... 310/9.1–9.4; 174/DIG. 3, 525

[56] References Cited
UNITED STATES PATENTS

| | | | |
|---|---|---|---|
| 1,875,324 | 9/1932 | Bower | 310/9.4 |
| 2,341,683 | 2/1944 | Bailey | 310/9.4 |
| 2,409,838 | 10/1946 | Cress | 310/9.4 |
| 3,047,749 | 7/1962 | Fisher | 310/9.4 |
| 3,069,572 | 12/1962 | Dick et al. | 310/9.4 X |
| 3,173,035 | 3/1965 | Fisher | 310/9.4 X |
| 3,828,210 | 8/1974 | Livenick et al. | 310/9.1 X |
| 3,832,761 | 9/1974 | Sheahan et al. | 310/9.4 X |

FOREIGN PATENTS OR APPLICATIONS

| | | | |
|---|---|---|---|
| 216,054 | 7/1941 | Italy | 310/9.1 |
| 754,162 | 1/1954 | Germany | 310/9.1 |
| 667,387 | 10/1929 | France | 310/9.2 |

*Primary Examiner*—Mark O. Budd
*Attorney, Agent, or Firm*—Nathan Edelberg; Robert P. Gibson; Kenneth J. Murphy

[57] ABSTRACT

A ceramic package is disclosed which comprises a frame member having an aperture for accommodating a crystal resonator. The frame member includes mounting clips for supporting the crystal resonator in a desired vibratory mode. A bottom and top lid are then fastened to the frame to enclose the crystal to also enable hermetic sealing in an ultra high vacuum without the use of large deleterious forces.

The package provides a hermetic enclosure enabling improved frequency stability and overall reliability.

7 Claims, 14 Drawing Figures

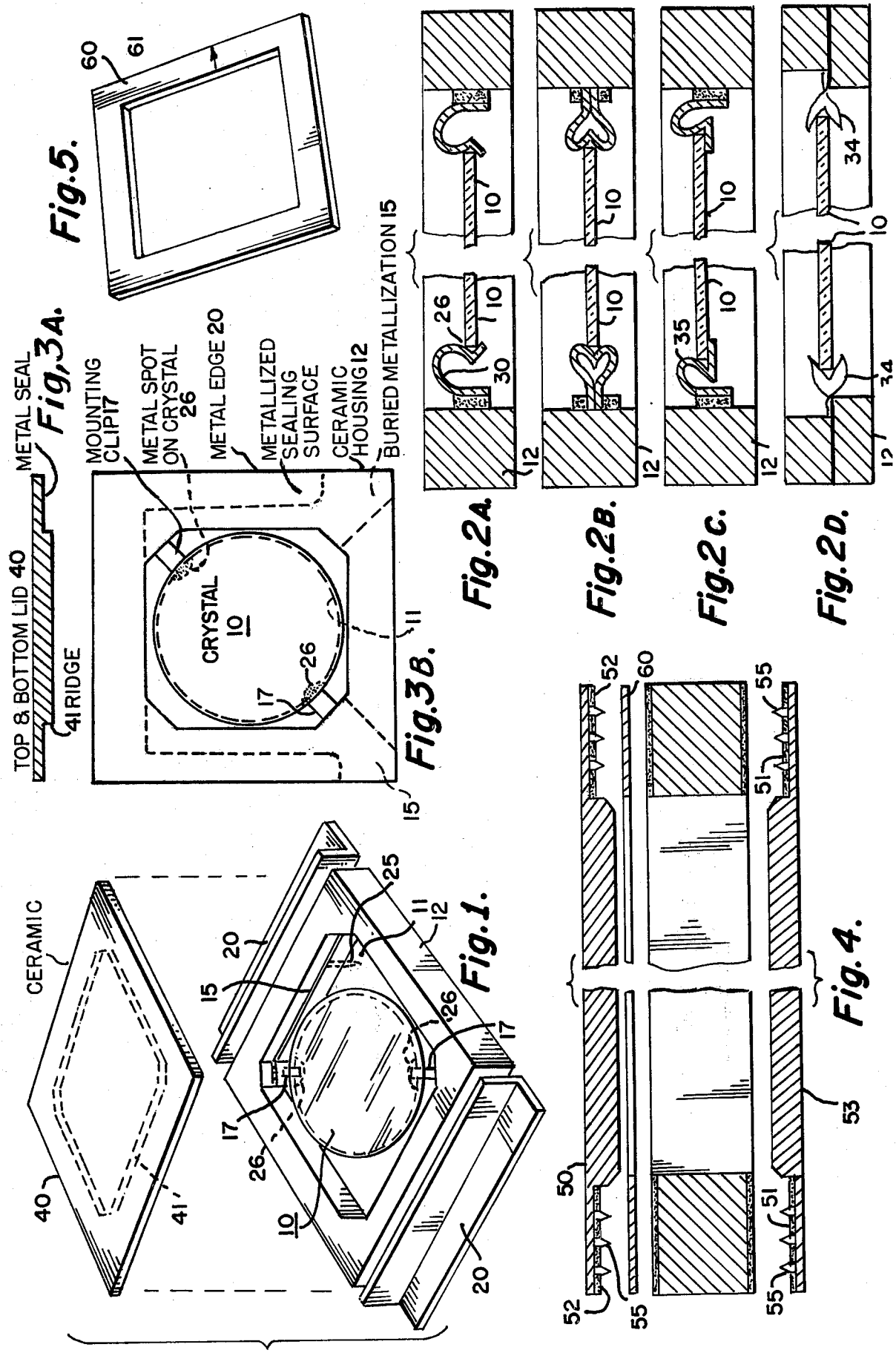

CRYSTAL RESONATOR HOUSING CONFIGURATIONS

BACKGROUND OF INVENTION

The invention described herein may be manufactured and used by or for the Government for governmental purposes without the payment of any royalties thereon or therefor.

Due to a crowded frequency spectrum and the general need for greater frequency stability, the crystal or quartz resonator has and will continue to be utilized as a secondary frequency standard or as a frequency source in devices as receivers, transmitters, generators and so on.

Crystalline quartz has great mechanical and chemical stability and a relatively small elastic hysteresis. These factors account for its widespread use as a resonator as well as the frequency determining component in an oscillator.

As is known, certain materials, including crystalline quartz exhibit the property of exchanging energy between electrical and mechanical states. For example, a mechanical force applied in the proper direction upon the material will cause an electrical charge to appear on the surfaces of the material, and conversely, an applied electrical potential will cause a mechanical displacement in the material. This is known and commonly referred to as the piezoelectric effect.

In use, a quartz resonator is mounted between conducting electrodes, now often thin metallic coatings deposited directly upon the crystal by an evaporation process. Mechanical support is provided at positions in the crystal and selected to avoid inhibition of a desired vibratory mode, while further serving, if possible, to suppress unwanted modes. An alternating voltage applied across the electrodes of the crystal causes it to vibrate at a frequency such that mechanical resonance exists within the crystal. The frequency of vibration or the crystal's resonant frequency is sharply defined and crystals have Q's the range of 10,000 and 100,000 or greater.

While the prior art has continued to improve the crystal resonator's stability, there is still further need for improved packaging to provide still greater stability and reliability.

Essentially, the major improvements in stability have been afforded by precision in temperature control, improved control to keep driving power to the crystal low and constant, improved cutting, mounting, bonding and sealing techniques; and cleaning and electro deposition techniques.

Of major concern is the mounting of the crystal resonator in a reliable, easily producible and adaptable package assembly.

Conventionally, a crystal user does not generally specify the mounting, but the same is left to the discretion of the manufacturer.

The size of the crystal package, type (glass envelope or metal can) lead type and lead size, are, in fact, generally selected by the user. However, once these characteristics are specified, the crystal, depending upon frequency, mode of vibration as flexure, longitudinal (extensional), face shear or thickness shear may be mounted in either a pressure air gap mounting, a pressure mounting, a dielectric sandwich mount, a solder lead mount, a cemented lead mount or a strap mount. Each has its own disadvantages and each can and does adversely effect the long term stability of the resonator.

For example, in a pressure mount, the crystal is held between two flat electrodes under a slight spring pressure. The spring adds mechanical impedance and lowers the Q of the crystal and hence, such devices operate with decreased frequency stability. The pressure air gap is not very rugged as the crystal is free to move in the space between the electrodes. However, air gap mounts are generally preferred when good stability is required and are also effective for high frequency crystals that vibrate in the thickness shear mode.

In any event, while each of the above prior art packages and mounts have advantages and disadvantages, none of them really solve the major problems affecting crystal stability.

An inherent characteristic of crystal resonators is that their frequency changes with time and this is referred to as aging.

The package affects the aging process greatly and can be a major contributor to the aging and thermal hysteresis in quartz resonators. Several of the factors which can cause aging and thermal hysteresis in regard to the packaging are changes in:
1. The mass of the resonator.
2. The pressure inside the resonator enclosure.
3. The stress on the resonator.
4. The electrode to quartz interfaces.
5. The quartz's crystal structure.

If one neglects all other effects and assumes that crystal aging is due entirely to a change in mass due to the adsorption and desorption, then the maximum allowable rate of change of mass is less than $10^{-3}$ monoatomic layers per week. At a $10^{-9}$ torr pressure, it can take less than one hour for a monolayer to form on a crystal's surface, this layer would cause a frequency change of about one part in $10^6$ for a 5MHz fundamental mode crystal.

Pressure changes inside the resonator enclosure can be caused by outgassing and leaks due to flaws in the package seals. When the pressure surrounding a 5MHz fundamental mode resonator is changed from vacuum to full atmosphere of dry nitrogen, the frequency shift is $-2 \times 10^{-7}$.

Among the important factors affecting the stress sensitivity of the resonator are the direction of the force, the crystal plane geometry, the crystal's angle of cut, the order of the overtone and the crystal frequency.

Stresses are caused by the mounting structure supporting the crystal in the holder, and by thin films which are deposited into the quartz.

Excessive heating of the resonator during the sealing process can affect both the crystalline structure and the electrodes.

Change at the electrode to quartz interface can occur due to thermal stresses, electrode diffusion, chemical reactions and the diffusion of adsorbed gases trapped at the interface.

It is therefore an object of the present invention to provide an improved crystal resonator package or housing configuration which configuration serves to avoid some of the above noted problems, while permitting compatibility with microcircuit techniques and further providing high yield packaging.

BRIEF DESCRIPTION OF PREFERRED EMBODIMENT

Apparatus for housing a force responsive assembly as a crystal resonator comprises an insulator, "frame-like" housing having an opening capable of surrounding a major portion of said crystal, said frame member including a metallic conducting material embedded in a sidewall of said frame and directed from said opening to an outside wall of said frame, at least one support member is secured to said frame and within said opening, said support member being electrically coupled to said metallic conducting material and capable of supporting said crystal in a desired vibratory mode and means coupled to said frame for hermetically sealing said crystal within said opening.

BRIEF DESCRIPTION OF FIGURES

FIG. 1 is a perspective plan view of a resonator and housing assembly according to this invention.

FIGS. 2A through 2D are partial side cross-sectional views showing various mounting clip configurations as taken through line 2—2 of FIG. 1.

FIG. 3A is a side view of a lid assembly used with the frame assembly of FIG. 3B.

FIG. 3B is a top view of a frame housing assembly for a resonator particularly indicating metallized areas.

FIG. 4 is a side cross-sectional view of a frame assembly with an alternate lid configuration.

FIG. 5 is a plan view of an O-ring structure used with the apparatus of FIG. 4.

DETAILED DESCRIPTION OF FIGURES

Figure 6:
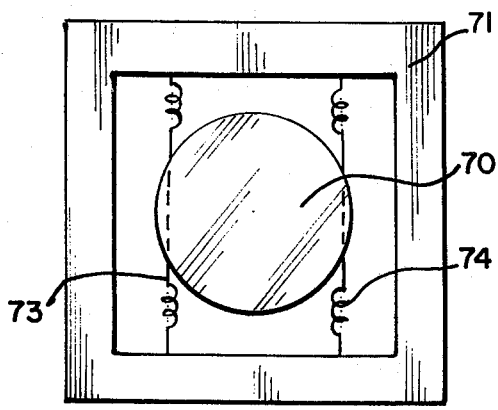
FIG. 6 is a top view of a frame and an alternate crystal mounting configuration.

Referring to FIG. 1, there is shown a perspective view of a crystal resonator and housing assembly.

Shown supported in the central aperture 11 of the ceramic frame member 12 is a crystal 10.

The member 12 has the appearance of a "picture" frame, but it is understood that any other suitable geometrical pattern could be employed according to the concepts of this invention. While the member is shown as a complete 4-sided rectangular structure, it can assume many other numerous geometrical configurations and may be U-shaped, C-shaped, hexogonal, polygonal, and so on. The term frame member is used in a generic sense and may comprise a 3-sided or n-sided structure.

The rectangular or square frame member, as 12 may be preferable for many applications as it is easy to stack or to place side by side to obtain maximum surface coverage for multiple units. The member 12 is fabricated from a insulating material such as an alumina or berriyllia ceramic. Such ceramics have excellent mechanical, thermal and electrical properties and they can be readily metallized with materials such as Au, Mo — Mn and Au — Pd.

The ceramic member 12 has a layer of metal 15 buried within each of two opposing sidewalls for interconnection purposes. To accomplish this, the member 12 may be fabricated from layered ceramic tape or a multilayer ceramic technique, with the buried metallization layers 15. Such techniques for providing layered ceramics and metallizations are known in the art and are described in a paper entitled "ADVANCED INTERCONNECTION AND PACKAGING TECHNIQUES FOR INTEGRATED CIRCUITS"; by R. W. Ilgenfritz, J. S. Keohane and W. D. Walter, all of the Raytheon Company, Final Report, Contract No. DAA-BO7-69-0472, June, 1972.

The crystal 10 which may be of any desired cut is fabricated from a piezoelectric material and is mounted on two mounting clips 17 located at opposite corners of the annular member 12.

The clips 17 are thus shown by way of example and one could employ more or less depending upon the nature of the crystal cut and its attendant vibratory mode. For example, an X-cut crystal will not oscillate if its edge movement is restrained or restricted, because the X-cut mode of vibration is extensional. On the other hand, the AT crystal which operates in the thickness-shear mode, can operate when the crystal edges are clamped. Such factors are known in the art and one so skilled will readily visualize mounting clip placement to support any type crystal as 10.

Also shown are two L-shaped metal brackets or strips 20 which strips 20 are joined to the buried metallized layers 15 at the sides of the frame 12, which side is metallized for ease of attachment to a microcircuit substrate or a printed-circuit (PC) board. The metal L-shaped strips 20 may be spot or seam welded to the ceramic member 12 at the metallized edges at relatively low temperatures and hence, this process will not heat up or adversely affect the crystal resonator 10.

In lieu of the metal L-shaped strips 20, one could attach wire leads directly to the metallized edges or by means of lugs.

Alternatively, a pin or post as 25 could be embedded in the ceramic member 12 during the fabrication process. The post 25 is fabricated from a conducting metal and is positioned to contact the buried metallization layer 15.

Prior to mounting, the crystal 10 within the central aperture 11 of the frame member 12, a metal thin film spot 26 is deposited near the edges of the crystal 10 and opposite the position of the mounting clips 17. In order for the metal film spot 26 to have maximum adhesion to the quartz crystal 10 while producing a minimum amount of stresses, the film spot 26 is a composite of a very thin layer of a metal that reacts controllably with the quartz, plus a ductile metal coating. Examples of such composites are Cr — Au, Ti — Au, Ta — Au, Nb — Au, plus various three component systems such as Ti — Pd — Au and Ti — Pt — Au.

Referring to FIGS. 2A, B, C and D, a few configurations for mounting clips as 17 are shown. The same numeral 12 has been retained for the frame member.

As seen in FIG. 2A, the crystal 10 is mounted with the metal spots 26 resting on the clips 30. The metal spots 26 are joined or secured to the clip 30 with an electrobonding, a thermocompression bonding or a solder or cement bonding technique. If nickel electrobonding is used, the clip configurations shown in FIGS. 2A, 2B and 2D are preferable over that shown in FIG. 2C.

In the prior figures, the initial contact between the quartz crystal or wafer 10 and the clip as 30 (FIG. 2A)

is two points or a line. As the Ni film builds up, there is a minimal danger of the electrobonding solution being trapped between the two flat surfaces (i.e., the crystal surface and the clip surface.)

The clip configuration 35 of FIG. 2C provides the necessary sealing surface for thermocompression bonding, but it is less desirable for Ni electrobonding because of the larger contact area.

FIG. 2D shows an extremely useful clip configuration which comprises two V-shaped metallic members 34, which may be fabricated from a stainless steel. The edges of the crystal 10 (FIG. 2D) touch the V-shaped clips at two points so that the Ni electrobonding can be performed without trapping of the bonding solution.

Typically, the clips were fabricated from 0.002 inch thick stainless steel and the V-shaped edges were photoetched to a desired configuration such as a V-shaped edge or a V-shaped pattern containing circular sides instead of straight line portions.

An important advantage of the electroplated nickel bonding process is that a relatively strain free mount is provided for the crystal 10. Initially, the clips 30 are made to be more flexible than the quartz crystal 10. Subsequent to mounting the crystal 10, the clips 30 are strengthened as required by depositing upon their surfaces a sufficient thickness of nickel.

Although the intrinsic stress in nickel films is relatively large, the total stress can be substantially reduced by a careful selection of deposition conditions. In fact, the stress can almost be eliminated for a given temperature.

As indicated, while FIGS. 1 and 2 show two clips, added shock resistance can be acheived by using four clips as one in each corner of the package, or more if necessary.

Referring to FIG. 1, it is shown that the top surface of the frame member 12, as well as the bottom surface (not shown) are metallized. A lid 40 corresponding to the top surface of the member 12 is fabricated from a ceramic or a metal and has a central plateau or ridge 41 which is approximately congruent to the central aperture 11 of the member 12. While a central plateau or ridge is shown, it is understood that this can be eliminated. It is understood that a similar lid as 40 exists for the bottom of the frame member 12 as well. The underneath surfaces of the lids 40 are also metallized to correspond to the metallization of the top and bottom surfaces of the annular member 12. The top and bottom lids serve to seal the central aperture of the frame member 12 and to thereby enclose the crystal resonator in a most reliable and efficient manner as will be explained. Thus, the corresponding surfaces of the top and bottom lids are metallized to coact with the outer peripheral top and bottom surfaces of the frame member 12.

Since the top and bottom surface of theh frame are metallized, one can use these layers to contact the crystal mounting clips 30 to thereby provide terminal points for the crystal.

FIG. 3B also shows a top planar view of the metallized areas of the frame member 12 with the appropriate areas further designated by written legend for clarity. FIG. 3A shows a ridged lid assembly 40 which can be used as a top or bottom cover member.

Cohesion in a metal is due to the interaction of the conduction electrons with the metallic ions. If the surfaces of two atomically clean metal parts are brought together close enough for the free electrons to travel freely between the two parts, then good adhesion, (i.e. a good weld) will result. The surfaces of the lid 40 and the ring 12 are such parts.

Hence, similar metal surfaces will weld under near zero pressures provided both surfaces are atomically clean. The major, and probably only, barrier to metallic adhesion is contamination. Even when dissimilar metal couples were tested, and even when the metal couples were insoluble in one another, good welds were acheived in ultrahigh vacuum, provided the surfaces had been rigorously cleaned. The welds showed strengths comparable to the bulk strength of the weaker couple member, even when the loadings on couples consisting of a flat plate and sperical indenter were under 0.05 grams. Under such light loads, the deformations at the interface were predominantly elastic. For clean surfaces, the adhesion strength showed no load dependence. The only effect of increased loading was to increase the real area of physical contact. The force needed to separate the surfaces, divided by the real area of contact, remained a constant, however.

For contaminated surfaces, good welds could be produced only if the metal surfaces were compressed to loads well in excess of the elastic limits of the metals. The presence of only a few monolayers of contamination substantially reduced the junction strengths. In general, the more contaminated the surfaces are, the higher the percentage of mechanical deformation that is necessary to acheive a bond strength near the bulk strength of the metals.

The effect of the compressive load is to disperse the contaminants and thereby permit clean metal to clean metal adhesion to occur. Other means of contaminant dispersal are heat, ultrasonic waves, particle bombardment, shock waves, interfacial motion, and various combinations of these.

In cold welding, as practiced by the electronics industry today, the welding dies are so constructed that the interface atoms move in a direction perpendicular to the die movement. A clean surface is exposed which permits the welding to take place. In order to hermetically seal electronic packages by cold welding, hydraulic presses capable of applying several tons are generally required.

In thermocompression bonding, a combination of heat and pressure are used to disperse contaminants at the bond interface. The surfaces to be joined are brought into intimate contact by a shaped bonding tool such as a wedge or ball. Heating the bonding tool promotes intimate contact with a minimum of applied force. The heat lowers the compressive yield strengths of the interface materials, and accelerates the diffusion of contaminants away from the interface. Although the pressure required by thermocompression bonding is less than that required by cold welding, it must still be high enough to cause an appreciable deformation at the interface.

There are several other methods available for sealing a package hermetically in high vacuum. Among these are: electron beam welding, laser welding, parallel seam and other resistance welding, ultrasonic bonding, and reflow soldering. Each of these involves heating to fairly high temperatures and thus presents a greater potential for outgassing. Also, most of these require relatively complex and expensive equipment.

Of all, the sealing method utilized relies on the adhesion between atomically clean surfaces and is the simplest and least contaminating. Theoretically, if the sealing surfaces of the surfaces are perfectly clean and perfectly flat, then when the lids 40 are placed on the frame 12, a hermetic seal would result without the application of either heat or pressure. In practice, the sealing surfaces are plated with a soft material such as gold, tin, indium or their alloys. Several metals which form stable oxides, e.g. Al, Fe, Nb, Cu and Ti showed good adhesion to $Al_2O_3$ in high vacuum, when both surfaces had been rigorously cleaned. One or more small diameter wire O-rings of a suitable material plus pressure and heat (if necessary) can be used to compensate for small surface irregularities and contaminants. Alternatively, the O-rings can be replaced with one or more triangular ridges on one of the sealing surfaces. A cross section of one such arrangement is shown in FIG. 4.

FIG. 4 depicts a top lid 50 and a bottom lid 53 with metallized areas 51 and 52 having projections dispersed across the surface to provide greater contact area and for compensating for surface irregularities. The ridges as 55 are generally triangular in shape but other shapes can suffice as well. Shown in FIG. 5 is an O-ring 60 of a smaller width dimension 61 than the metallized dimension of the lid or top peripheral dimension of the member 12. This ring 60 would be inserted between the lid and frame and would be secured thereto by a suitable but relatively small amount of heat and pressure. The same materials can be utilized to fabricate the O-ring 60 as above indicated.

The optimum sealing forces and sealing temperatures depend on the material used, and on the degree of cleanness that is produced and maintained during the sealing process.

The stability requirements on high precision quartz resonators dictate that during processing the highest possible degree of cleanness be maintained. The mounted resonators and package are given a rigorous chemical cleaning and are then inserted in the loading chamber of a semiautomatic final processing system. The last four processing operations, ion bombardment cleaning, bakeout, plating and sealing, are performed in an oil free ultrahigh vacuum system without venting between operation. The four main chambers of this system are designed to remain under vacuum continuously.

In such a system, low pressure and no heat is required to produce a hermetic seal. The pressure needs to be just enough to product intimate contact between the sealing surfaces at every point along the perimeter of the package.

In vacuum systems with higher residual pressures, correspondingly higher sealing pressures and temperatures will be required. For sealing at or near atmospheric pressure, alternate techniques, such as parallel seam welding, may be necessary and acceptable. At these pressures, outgassing during sealing is of little concern.

Once the package is sealed hermetically in ultrahigh vacuum, the ultimate pressure and the composition of the residual atmosphere in the enclosure is determined by the processes of evaporation, desorption, diffusion, and permeation associated with the enclosure material.

Materials having an appreciable vapor pressure at the highest temperature to which the enclosure is subjected during processing must be avoided. About one third of all elements have vapor pressures greater than $10^{-9}$ torr at 500°C.

Clean solid surfaces exposed to a gas are rapidly covered with adsorbed molecules. For physisorption, the desorption energies are generally less than 10 Kcal/mol, for chemisorption they are generally greater than 10 Kcal/mol.

The average time t which an adsorbed atom spends on the surface is given by $t = t \exp(Ed/RT)$ where $t$ is the adsorbed atom's period of vibration normal to the surface. $Ed$ is the desorption energy, $R$ is the gas constant and $T$ is the temperature.

At room temperature, $t<2m$ sec for physisorbed gases. In an ultrahigh vacuum system, where readsorption does not occur, physisorbed gases are desorbed almost instantaneously. For a chemisorbed gas with $E_d$ = 30 Kcal/mol, $t$ = 30 years; for $E_d$ = 40 Kcal/mol, $t$ = $21 \times 10^6$ years. If the mass of a 5 MHz fundamental mode resonator changes at the rate of one monolayer per 30 years, the corresponding aging rate is about one part in $10^9$ per week. If, however, the mass rate of change is a monolayer per 21 million years, the corresponding aging rate is about a part in $10^{15}$ per week. Chemisorbed gases with $E_d>40$ Kcal/mol can therefore be considered stable with time.

Desorption rates increase exponentially with increasing temperatures. When a surface is heated to 350°C in ultrahigh vacuum, gases with desorption energies up to about 40 Kcal/mol are rapidly desorbed. Therefore, if the resonator is designed for a maximum operating temperature of 70°C, then the aging due to desorption of surface contaminants can be eliminated by baking the resonator and the enclosure at 350°C, in ultrahigh vacuum, just prior to sealing.

As previously indicated, crystal resonators today are generally packaged in metal or glass enclosures. Metals and glasses typically contain 1 to 100 volume percent of gas in solid solution. These gases can and do diffuse to the surface and cause outgassing. Outgassing can also be caused by permeation through the enclosure walls.

For metals, the gas of greatest concern is hydrogen. It forms a true solid solution with a large number of metals such as Ni, Cu, steel and W. For most metals, the hydrogen solubility at room temperature is less than 1 volume %. For Ni it is nearly 10% and the metals which for hydrides, e.g. Ti and Ta, can dissolve as much as 1,000 times their volume. The solubilities of other gases are considerably less than 1 volume % at room temperature.

In glasses, the helium solubility is the largest. It amounts to 0.1 to 1 volume %, depending on the glass composition.

If an HC-6 type enclosure's walls contain 0.1 volume % of dissolved gases, the potential contamination contained in the walls is over 1,000 monolayers. To illustrate that diffusion and permeation can be a problem, one measured the effect of immersing in a hydrogen atmosphere a 5MHz copper plated fundamental mode crystal resonator which had been hermetically sealed in high vacuum in an HC-6 nickel enclosure. Three weeks after immersion in one atmosphere of $H_2$, the aging had increased to about 30 times the previous rate. Eight weeks after removing the hydrogen that surrounded the sealed resonator, the aging leveled off, but was still about five times greater than the rate just prior to the start of this experiment.

In another experiment, one immersed a hermetically sealed ($10^{-8}$ torr) HC-6 Kovar enclosure in an atmosphere of helium for 24 hours. The enclosure was then placed in a residual gas analyzer and was punctured. The partial pressure of helium in the enclosure was found to be about $10^{-4}$ torr. This is consistent with a calculation of the amount of helium that should have permeated through the glass beads of the glass-through-metal feedthrough.

The diffusion coefficients, solubilities and permeabilities of materials, each have an exponential dependence on temperature. The time dependence of the outgassing rates of most materials varies between $t^{-1}$ and $t^{-1/2}$. To obtain maximum outgassing during bakeout, it is therefore much more advantageous to increase the bakeout temperature rather than the bakeout time.

These considerations lead to the conclusion that the most desirable resonator enclosure is to be fabricated of a material that can be baked at high temperature, e.g. over 800°C, and has near zero permeability at temperatures up to the maximum operating temperature of the resonator.

The materials which come closest to the ideal are the high alumina ceramics. For example, 99.5% alumina can be safely baked at temperatures up to 1,650°C. These materials are also regarded as being practically impermeable to gases. The helium permeability for 99.5% $Al_2O_3$ ceramic has been measured only above 1,100°C. If this permeability data is extrapolated down to the temperatures at which the helium permeability of Corning 7740 glass is known, the permeability of the ceramic is lower by about a factor of $10^6$. The finite permeability at 1,100°C was attributed to the helium permeation through the glassy phase paths in the ceramic.

High alumina ceramics also have excellent mechanical, thermal and electrical properties, and they can readily be metallized with materials such as Au/Mo-Mn, and Au-Pd as above indicated.

Figure 7:
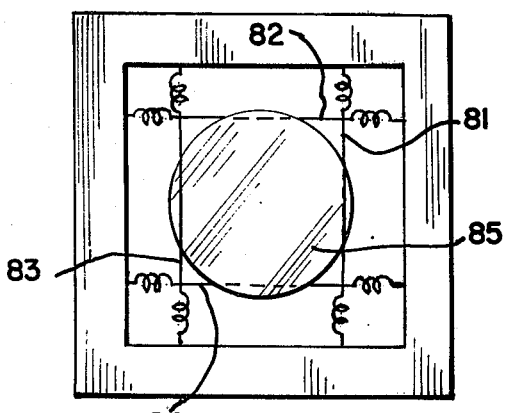
FIG. 7 is a top plan view of another mounting configuration.
Figure 8:
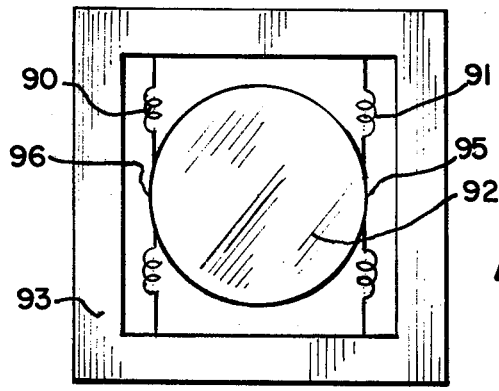
FIG. 8 is still another top plan view of a frame and alternate crystal mounting assembly.

Referring to FIGS. 6, 7 and 8 there is shown some alternate embodiments of supporting a crystal resonator within a ceramic package as above described without the use of the mounting clips as depicted in FIGS. 1 and 2.

In FIG. 6, nickel ribbons 73 and 74 are stretched and then secured to the walls of the housing 71 within the central aperture. The nickel ribbons 73 and 74 are twisted to form helices at appropriate ends as shown. The helices serve to center the crystal 70 and to maintain its proper position. The crystal may be spot welded to the ribbons 73 and 74 on suitable metallized areas.

In FIG. 7, four such ribbons 80,81 and 84 are utilized and one can see that this configuration serves to more securely hold the crystal 85. Two ribbons support the crystal from above and two below. Hence, the crystal 85 will be held in place during the bonding process. Alternatively, the ribbon can be replaced by wires.

The position of the nickel ribbon which is in contact with the crystal 85 is along the thickness of the crystal either at an angle or in a radius to prevent the electrobonding solution from being trapped.

FIG. 8 shows still a further mounting technique wherein two wires 90 and 91 containing helices for crystal positioning are strung across the ceramic frame 93. A depression or curvatures 95 and 96 are preset into the wires 90 and 91 and the crystal 92 is supported within the curvatures 95 and 96 at its outer side edges.

Thus, there has been described a compact crystal resonator unit and housing which serves to prevent mass transfer and pressure change effects of the crystal by assuring hermetic sealing in an ultrahigh vacuum. The surfaces between the lid and the frame are atomically clean as are the inner surfaces of the frame to thus prevent deleterious substances from diffusing into or reacting with the crystal. Due to the metallization techniques shown and described, low forces and temperatures are used to seal the package assembly. The packages, due to the ceramic lid and frame is baked in a vacuum at high temperature to prevent outgassing after sealing is accomplished. The crystal, due to the ribbon, wire and clip configurations, are mounted within the package essentially in a stress-free manner. The resonator is accessible from both sides of the package due to the buried metallization contact layers coupled to the clip or ribbon assembly and hence, electrodes or terminals can be deposited simultaneously on both sides of the blank. The package shown is thin, flat and allows two or more resonator units to be stacked in a small volume or to be conveniently attached to a microcircuit substrate or within an IC header. Due to the configuration, the package shown is easily producible at high yield and relatively low cost. The package further has the advantage that the stray capacitance contributed due to the package is relatively lower than currently existing assemblies.

Figure 9:
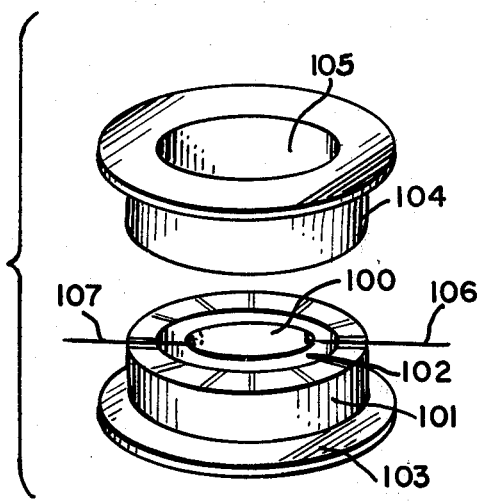
FIG. 9 is a perspective plan view of another enclosure according to this invention.
Figure 10:
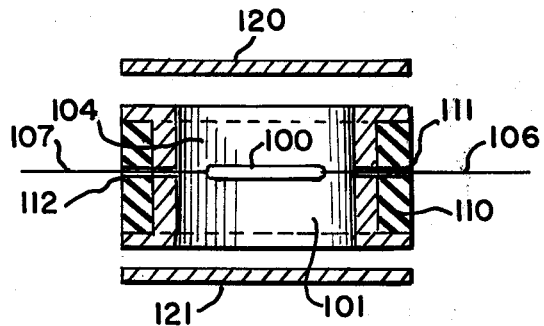
FIG. 10 is a cross-sectional view of an enclosure fabricated according to FIG. 9 also showing an outer retaining ring.

Referring to FIGS. 9 and 10, there is shown still another structure for providing an hermetic enclosure for a force responsive member as a crystal 100.

A ring 101 has an annular shape including a crystal accomodating central aperture 102. The ring has a bottom radially extending flange 103.

The top surface of the ring 101 is metallized. A congruent ring 104 has a bottom metallized surface and has a corresponding aperture 105 which is relatively congruent with aperture 102; and also has an extending radial flange.

The crystal is supported by relatively thin and flexible wires 106 and 107. The top ring 104 is placed over the bottom ring 101 in congruency (FIG. 10) with an intermediate retaining ring of a thickness equal to or less than the length of the flanges of rings 101 and 104.

The outer or retaining ring 110 has at least two wire accommodating slots 111 and 112 in the sidewall for accommodating wires 106 and 107. The composite assembly includes top and bottom cover members 120 and 121. The outer ring 110 may be slightly larger than the composite height of the inner rings 101 and 104. Thence, one could hermetically seal the entire assembly by utilizing cold weld dies. The dies would exert forces on only the top and bottom covers 120 and 121 and the outer ring 110; thus assuring that any feedthrough arrangement for wires 106 and 107, which might include a glass to metal feedthrough, would not break or rupture during the sealing process. The seal would therefore be made between the metallized cover and metal flanges of the rings 101 and 104; to provide an hermetic seal.

Although the above embodiment shows a circular package, there are, of course, many double walled configurations possible and therefore, one can utilize practically any geometrical pattern, including polygons which may be particularly suitable for high shock resistant mounts.

For example, if $n$ supports are needed, one could select an n sided polygon and have a support at each corner. Since the inner member, which has a lead feedthrough aperture, does not have any force on it, it could be fabricated from any lower vapor pressure material, as a glass or ceramic.

In a similar matter, the top and bottom plates in FIG. 10 could be made with any material as long as the material could be hermetically joined to the ring material.

Many other modifications will become apparent to those skilled in the art without departing from the spirit and scope of the invention as evidenced by the claims appended hereto.

We claim:

1. A force responsive resonator assembly of the type capable of mechanically vibrating or flexing at a predetermined rate, comprising:
   a. a crystal having parallel upper and lower surfaces and a squared outer edge;
   b. a frame assembly having a central aperture, said frame assembly fabricated from an insulator material and including first and second layers of metallic conducting material embedded in the wall of said assembly, said first and second layers aligned in a common plane and located on opposite sides of said aperture;
   c. first and second support members mounted on said frame located within said aperture and electrically coupled to said first and second layers of said metallic conducting material;
   d. each said support member comprising a flexible curved ribbon member secured within said central aperture and electrically connected to said first and second layers of said metallic conducting material, said ribbon member including a V-shaped slot having a width substantially greater than the height of said crystal;
   e. said crystal being mounted in said central aperture with said edges of said crystal extending into said V-shaped slots, said edges being joined to said ribbon members along a line at the upper and lower periphery of said edges; and
   f. means coupled to said frame assembly at both ends of said central aperture to hermetically enclose said force responsive member within the hollow formed by said aperture.

2. The apparatus according to claim 1 wherein said insulator material is a ceramic material.

3. The apparatus according to claim 1 wherein said frame assembly is fabricated from a high alumina ceramic including at least 90% or more of alumina.

4. The apparatus according to claim 1 wherein said frame assembly is fabricated from a berriyllia ceramic.

5. The apparatus according to claim 1 wherein said means coupled to said frame assembly includes a layer of deposited metal about the perimeter of said frame at said top and bottom ends.

6. The apparatus according to claim 5 wherein said means coupled to said frame assembly comprise a top and bottom lid cover members having a centrally located ridge approximately congruent with said central aperture for insertion thereto, the edges of said lid nesting about the metallized perimeter of said frame at said top and bottom ends, and a layer of metal covering that portion of each lid coacting with said frame perimeter at said appropriate end to permit the formation of an adhesion bond to thereby enclose the hollow confines formed by said frame aperture.

7. The apparatus according to claim 1 wherein said frame assembly is fabricated from a ceramic tape.

* * * * *